US010211863B1

(12) United States Patent
Grens

(10) Patent No.: US 10,211,863 B1
(45) Date of Patent: Feb. 19, 2019

(54) COMPLEMENTARY AUTOMATIC GAIN CONTROL FOR ANTI-JAM COMMUNICATIONS

(71) Applicant: BAE Systems Information and Electronic Systems Integration Inc, Nashua, NH (US)

(72) Inventor: Curtis M. Grens, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/677,528

(22) Filed: Aug. 15, 2017

(51) Int. Cl.
*H04B 1/10* (2006.01)
*H04K 3/00* (2006.01)
*H03G 3/30* (2006.01)

(52) U.S. Cl.
CPC ......... *H04B 1/1036* (2013.01); *H03G 3/3036* (2013.01); *H04K 3/228* (2013.01); *H04B 2001/1063* (2013.01)

(58) Field of Classification Search
CPC ..... H04B 1/1036; H03G 3/3036; H04K 3/228
USPC ........................................................ 375/345
See application file for complete search history.

(56) References Cited

U.S. PATENT DOCUMENTS

| 6,166,690 | A | 12/2000 | Lin et al. |
| 6,724,840 | B1 | 4/2004 | Osofsky et al. |
| 7,340,218 | B2 | 3/2008 | Shoulders et al. |
| 2002/0042256 | A1* | 4/2002 | Baldwin ............... H03D 3/008 455/232.1 |
| 2002/0126650 | A1* | 9/2002 | Hall ...................... H01Q 1/246 370/349 |
| 2003/0128776 | A1* | 7/2003 | Rawlins .................. H04B 1/30 375/319 |
| 2006/0184859 | A1* | 8/2006 | Jibry .................. G11B 20/1816 714/769 |

(Continued)

OTHER PUBLICATIONS

Cummings, William C., "An Adaptive Nulling Antenna for Military Satellite Communications," The Lincoln Laboratory Journal, vol. 5, No. 2, 1992. pp. 173-194.

(Continued)

*Primary Examiner* — Michael R Neff
(74) *Attorney, Agent, or Firm* — Finch & Maloney PLLC; Scott J. Asmus

(57) ABSTRACT

Anti-jamming techniques are provided for RF receivers, such as those that operate in hostile environments. In some embodiments, the techniques are embodied in an anti-jam communications system configured with automatic gain control (AGC) that is complementary. The system includes a first AGC circuit prior to an interference suppression circuit and a second AGC circuit after the interference suppression circuit. The first AGC circuit operates to adjust the power level presented to the interference suppression circuit to facilitate interference cancellation. The second AGC circuit operates to maintain the original power level of the desired communications signal and prevent amplitude errors as the first AGC circuit responds to fluctuations in jammer signal power. The second AGC can be slaved to the first AGC circuit such that the sum of two gain values is held constant, according to some embodiments. In this manner, the first and second AGC circuits provide a complementary-AGC system.

19 Claims, 7 Drawing Sheets

(56) References Cited

U.S. PATENT DOCUMENTS

2007/0153878 A1* 7/2007 Filipovic .............. H04B 1/1036
                                                              375/147
2014/0253381 A1   9/2014 Lackey

OTHER PUBLICATIONS

Whitlow, Dana, "Design and Operation of Automatic Gain Control Loops for Receivers in Modern Communcations Systems," URL: http://www.analog.com/media/en/training-seminars/tutorials/42575412022953450461111812375Design_and_Operation_of_AGC_Loops.pdf. Jul. 12, 2017. 5 pages.

* cited by examiner

US 10,211,863 B1

COMPLEMENTARY AUTOMATIC GAIN CONTROL FOR ANTI-JAM COMMUNICATIONS

STATEMENT OF GOVERNMENT INTEREST

The invention was made with United States Government support under Contract No. FA8750-11-C-0189 awarded by U.S. Dept of the Air Force. The United States Government has certain rights in this invention.

FIELD OF THE DISCLOSURE

The present disclosure relates to communication systems, and more particularly, to anti-jamming techniques for RF receivers intended to operate in noisy or hostile environments.

BACKGROUND OF THE DISCLOSURE

A typical radio frequency (RF) communications receiver generally includes an RF front end and a demodulator stage. The RF front end stage generally includes an antenna to capture RF signals, a filter to remove unwanted signals to isolate a desired RF signal, an amplifier to amplify the desired RF signal, and down-conversion circuitry (mixer and oscillator) to convert the RF signal to an intermediate frequency (IF) band. The IF signal can then be further processed by the demodulator stage, and its payload converted to the digital domain, and used as needed for the given application. An RF front end of a communications receiver that operates in hostile signal environments, such as a receiver that is subjected to strong blockers or jamming signals, may require anti-jam hardware. There are a number of non-trivial issues that arise with respect to implementing anti-jam hardware.

DETAILED DESCRIPTION

Figure 1:
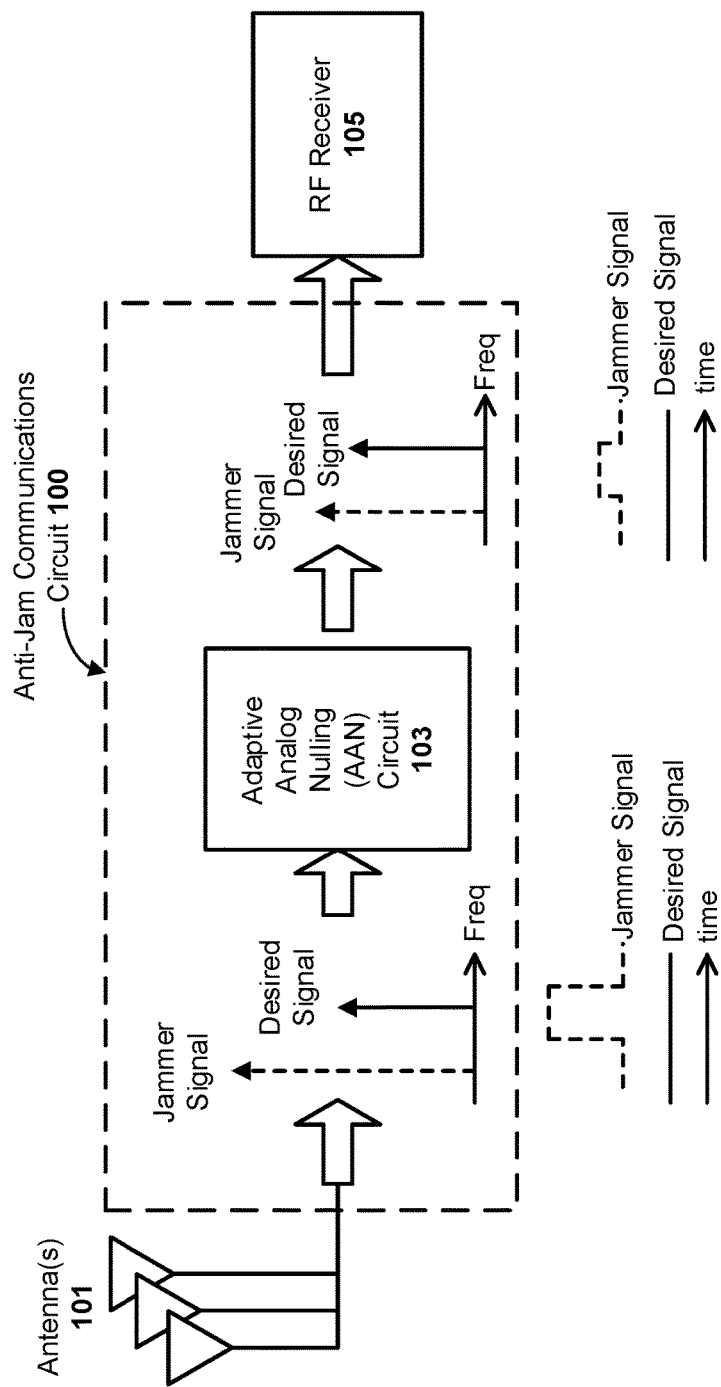
FIG. 1 illustrates an RF receiver system configured with adaptive analog nulling (AAN).

Anti-jamming techniques are provided for RF receivers, such as receivers intended to operate in noisy or hostile environments. In some embodiments, the techniques are embodied in an anti-jam communications system configured with complementary automatic gain control (C-AGC). The system includes a first AGC circuit prior to an adaptive analog nulling (AAN) circuit, and a second AGC circuit after the AAN circuit. The first AGC circuit operates to adjust the power level presented to the AAN circuit to facilitate interference cancellation. The second AGC circuit operates to maintain the original power level of the desired communications signal and prevent amplitude errors as the first AGC circuit responds to fluctuations in jammer signal power. The second AGC can be slaved to the first AGC circuit such that the sum of two gain values is held constant, according to some embodiments. In this manner, the first and second AGC circuits provide a complementary-AGC system. In other embodiments, such a complementary-AGC system may also be used in conjunction with a tunable notch filter or other adaptable attenuation circuit for jam suppression instead of analog adaptive nulling. In such cases, if the tunable filter experiences distortion at high power levels, the complementary-AGC system could maximize system dynamic range of the filter while avoiding modulation of the desired communications signal amplitude with changes in interference signal power. Numerous configurations including any number and types of interference suppression circuits used in conjunction with a complementary-AGC system will be apparent in light of this disclosure.

GENERAL OVERVIEW

As previously noted, there are a number of non-trivial issues that arise with respect to implementing anti-jam hardware in the context of an RF receiver. For instance, an RF front end of a communications receiver that operates in hostile signal environments may require anti-jam hardware to maintain communications in the presence of high power blockers or jamming signals. One possible anti-jam hardware solution is to use an adaptive antenna array to provide analog adaptive nulling (AAN) of an interference source. Unfortunately, the amplitude of the jamming source is often not known beforehand and can vary, which may affect the performance and reliability of the AAN circuit in practical systems. One possible approach to address this issue is adding an automatic gain control (AGC) circuit in the receiver chain prior to the anti-jam hardware, to adjust the power level presented to the AAN circuit. This in turn allows for optimal interference cancellation and an increase in effective dynamic range of the AAN circuit, while also preventing damage to the AAN circuit from input power spikes. However, rapid adjustment of the AGC circuit, responding to changes in the interference source, may also impact the amplitude of the desired communications signal (sometimes referred to herein as a comms signal)—potentially corrupting the that signal, increasing bit error rate (BER), and reducing data throughput.

Thus, and in accordance with an embodiment of the present disclosure, a complementary-AGC system is disclosed for use with an RF receiver system configured with adaptive analog nulling (AAN) circuit. The system includes a first automatic gain control (AGC) circuit prior to the AAN circuit, and a second AGC circuit after the AAN circuit. The first AGC circuit operates to adjust the power level presented to the AAN circuit for interference cancellation and increase the AAN circuit's effective dynamic range. In addition, the first AGC circuit can help in preventing damage to the AAN circuit from input power spikes (e.g., large signal interferers). The second AGC circuit operates to maintain the original power level of the desired communications signal and prevent amplitude errors as the first AGC circuit responds to fluctuations in jammer signal power. The second AGC can be slaved to the first AGC circuit to compensate for its gain adjustment such that the sum of two gain values is held constant, according to some embodiments.

In other embodiments, such a complementary-AGC system may also be used in conjunction with a tunable notch filter or other analog interference suppression circuit for anti-jamming, instead of analog adaptive nulling (AAN). In such cases, if the tunable filter or other interference suppression circuit experiences distortion at high power levels, the complementary-AGC system could maximize system dynamic range of the filter while avoiding modulation of the desired communications signal amplitude with changes in interference signal power. Such alternatives like a tunable notch filter may be useful particularly in scenarios where the jammer signal is smaller than the desired signal. This is because an AAN locks on to the largest signal source in the band, and adapts to cancel that largest signal, even if it happens to be the desired signal. So, in some embodiments having both an AAN and a tunable notch, the AAN can be switched out of the circuit or otherwise disabled (and the tunable notch can be switched in or otherwise enabled) if the jammer is smaller than the desired comms signal. Still other embodiments may just employ a tunable notch filter.

The techniques provided herein can be used in any number of applications, including military and commercial. Note that the interfering signals may be intentional interferers (e.g., jamming signals intended to jam the given receiver), but may also be unintentional (e.g., simply signals from a local noise source that happen to interfere with the given receiver). The techniques can be employed with any number of receiver systems, such as superheterodyne and direct conversion receiver architectures, as will be further appreciated.

System Architecture

FIG. 1 illustrates an RF receiver system configured with adaptive analog nulling (AAN). As can be seen, the system includes an anti-jam communications circuit 100 operatively coupled between antenna(s) 101 and an RF receiver 105. The antenna(s) 101 is an adaptive array such as, for example, a multi-element controlled radiation pattern antenna (CRPA). The antenna(s) 101 may utilize, for instance, microstrip patches, directional, and/or omni-directional elements to feed the AAN circuit 103, to name a few examples. The AAN circuit 103 can be implemented with any number of configurations designed to suppress interference within a given communication band, as will be further appreciated in light of this disclosure. The RF receiver 105 can be any receiver configuration, such as a super heterodyne receiver or a direct conversion receiver or a customized receiver.

In operation, the antenna(s) 101 collect RF signals within a certain spectrum of frequency. The spectrum may be relatively broad or narrow, or otherwise customized, depending on the given application. Some of signal captured by the antenna(s) 101 may be desired signals (generally depicted with solid vertical arrows), but other signal captured by the antenna(s) 101 may be undesired interference, such as noise and/or countermeasure or so-called jamming signals designed to interfere with the performance of the RF receiver 105. Such interference signals are collectively referred to herein as jammer signals (generally depicted with dashed vertical arrows), for purposes of brevity. Note how in this example, the jammer signal is actually larger than the desired signal (with respect to signal magnitude). In other scenarios, the jammer signal may be smaller than the desired signal or about the same magnitude as the desired. In any such cases, the jammer signal may interfere with the desired signal, and therefore poses a threat to proper operation of the receiver system.

The AAN 103 is configured to reduce the jammer signal input power going into the RF receiver 105. As will be appreciated, the amount of jammer signal reduction can vary from one case to the next, but generally is such that the resulting jammer signal amplitude (at the output of the AAN 103) is below a given threshold or otherwise sufficiently low to allow proper functioning of the RF receiver system 105 for its intended purpose with respect to processing the desired signal. In some example cases, for instance, the threshold may be a relative threshold such as the case where the amplitude (or magnitude, as the case may be) of the suppressed jammer signal must be at least 25 dB less than the amplitude of the desired signal. In other example cases, the threshold may be an absolute threshold such as the case where the amplitude of the suppressed jammer signal must be less than −30 dB. Any number of adaptive analog nulling schemes can be employed, and the present disclosure is not intended to be limited to any particular such schemes.

In any such cases, note that nulling becomes less effective if the jammer signal input power falls below a certain level. In particular, relatively low jammer signal input power results in less improvement in output jam signal/desired signal ratio (J/D). On the other hand, if the jammer signal input power is too large or otherwise excessively high, the AAN circuit 103 can experience instabilities or component damage. Thus, without more, the anti-jam communication circuit 100 is susceptible to insufficient jammer signal suppression and/or damage to AAN circuit 103, depending on the nature of the jammer signal.

Figure 2:
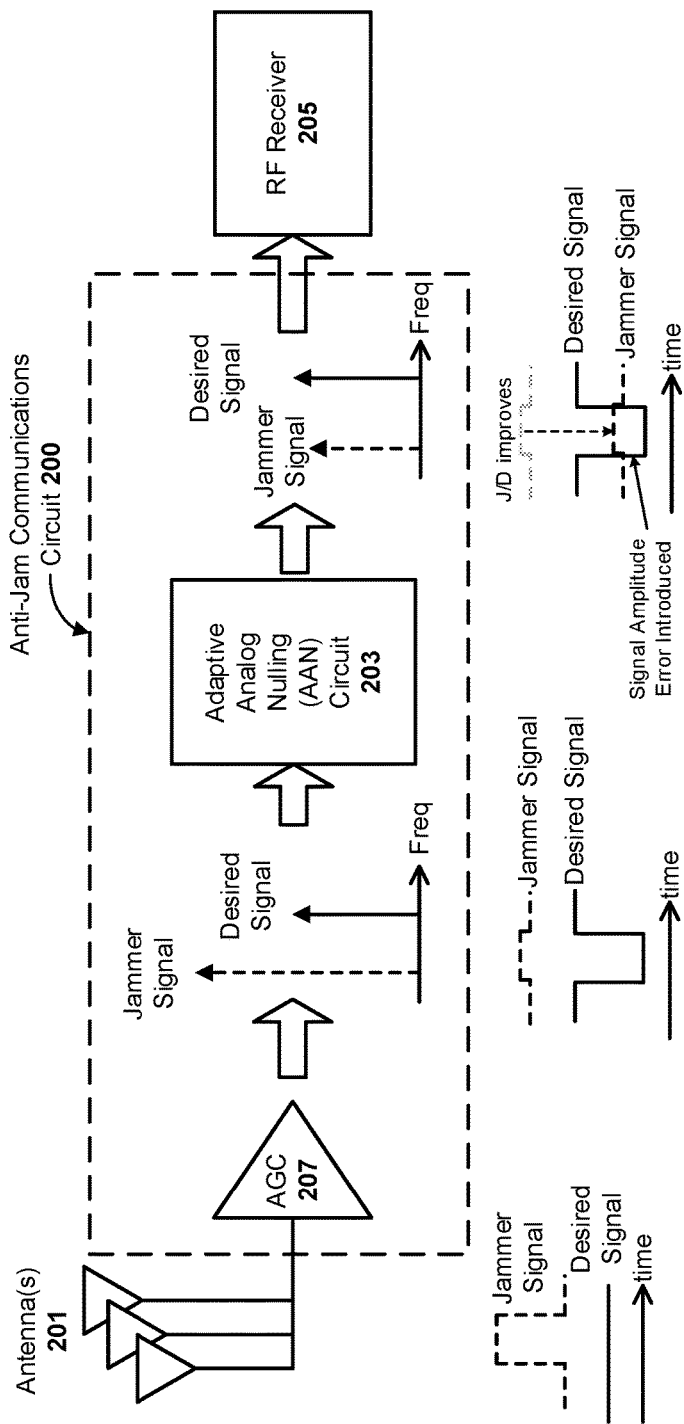
FIG. 2 illustrates an RF receiver system configured with adaptive analog nulling (AAN) and automatic gain control (AGC), in accordance with an embodiment of the present disclosure.

FIG. 2 illustrates an RF receiver system configured with adaptive analog nulling (AAN) and automatic gain control (AGC), in accordance with an embodiment of the present disclosure. As can be seen, the system includes an anti-jam communications circuit 200 operatively coupled between antenna(s) 201 and an RF receiver 205, in a similar fashion to FIG. 1. As can be further seen, however, an automatic gain control (AGC) circuit 207 has been added between antenna(s) 201 and the AAN circuit 203. The previous relevant discussion with reference to antenna(s) 101, AAN circuit 103, and RF receiver 105 is equally applicable here, with respect to antenna(s) 201, AAN circuit 203, and RF receiver 205, as will be appreciated. However, in this example embodiment and as will be further appreciated in light of this disclosure, the AGC circuit 207 can maintain an optimal or otherwise expected input power at the AAN circuit 203 for effective nulling (the J/D ratio can be set as desired), while simultaneously protecting the AAN circuit 203 from excessive input power levels.

In general, existing anti-jam solutions do not include automatic gain control prior to the AAN circuit 203. Without AGC, however, the effectiveness of the adaptive nulling tends to decrease as the interferer power goes down, due to noise and DC offset errors in the control system. Therefore, an adaptive array system with an AGC input stage can provide optimal or otherwise enhanced anti-jam performance over a wider dynamic range relative to a similar system without AGC. However, simply including AGC at the RF front end of the anti-jam communication circuit 203 can be problematic as well. In particular, a fast AGC response to changes in the interferer (jammer signal) level will be reflected in the desired signal as well, as graphically depicted in FIG. 2. In general, the relatively high amplitude of the jammer signal at the input of the AGC circuit 207 is decreased to a predetermined level at the output of the AGC circuit 207. However, the AGC circuit 207 also causes an equal attenuation of the desired signal. This AGC adjustment afforded by AGC circuit 207 causes the amplitude of the desired signal being received by the RF receiver 205 to vary with changes in jammer signal input power, which can in turn lead to decoding errors. Such decoding errors cause the RF receiver 205 to halt data recovery until the signal amplitude has settled, which in turn reduces throughput of the RF receiver 205.

In more detail, as can be seen in FIG. 2, the time domain response from fast-AGC provisioned by AGC circuit 207 reduces gain during the jammer signal, as generally shown by the dashed line jammer signal received at the input of AGC circuit 207 and the relatively lower dashed line jammer signal at the output of the AGC circuit 207. Further note the reduction in the desired signal at the output of AGC circuit 207. The AAN circuit 203 further reduces the jammer signal power, as generally depicted in the time domain at the output of AAN circuit 203. Further note how AGC circuit 207 provides consistent improvement to ratio of jammer to desired signal (J/D ratio) regardless of jammer signal input power, but introduces errors to the desired signal amplitude. Thus, the anti-jam communication circuit 200 is susceptible to signal decoding errors which in turn leads to poor throughput at the receiver.

Figure 3:
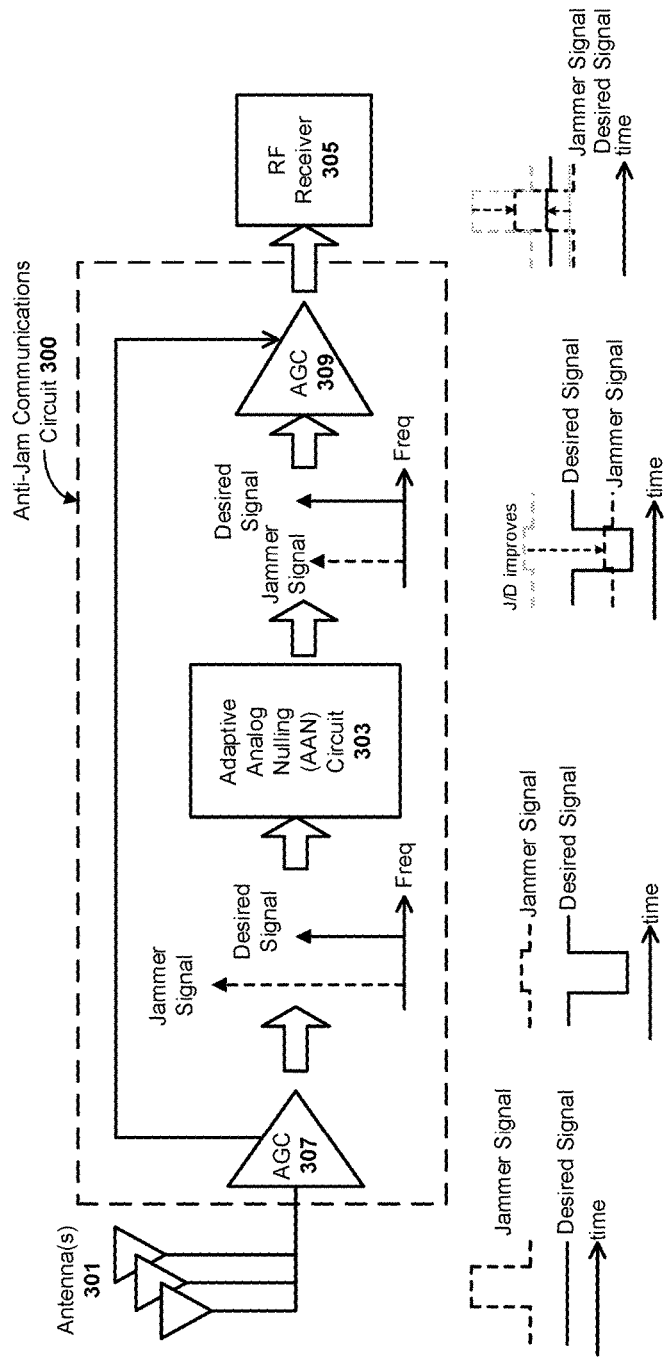
FIG. 3 illustrates an RF receiver system configured with adaptive analog nulling (AAN) and complementary automatic gain control (C-AGC), in accordance with an embodiment of the present disclosure.

FIG. 3 illustrates an RF receiver system configured with adaptive analog nulling (AAN) and complementary automatic gain control (C-AGC), in accordance with an embodiment of the present disclosure. As can be seen, the system includes an anti-jam communications circuit 300 operatively coupled between antenna(s) 301 and an RF receiver 305, in a similar fashion to FIG. 1. As can be further seen, however, a first automatic gain control (AGC) circuit 307 has been added between the antenna(s) 301 and the AAN circuit 303, and a second AGC 309 has been added between the AAN circuit 303 and the RF receiver 305. The previous relevant discussion with reference to antenna(s) 101, AAN circuit 103, and RF receiver 105 is equally applicable here, with respect to antenna(s) 301, AAN circuit 303, and RF receiver 305, as will be appreciated in light of this disclosure.

However, in this example embodiment, the AGC circuit 307 can maintain an optimal input power at the AAN circuit 303 for effective nulling (the J/D ratio can be set as desired), while simultaneously protecting the AAN circuit 303 from excessive input power levels. The impact that the AGC circuit 307 has on the received signals (including both the desired and jammer signals) is depicted graphically, by way of the input signal pulses (in the time domain) at the input and output of AGC circuit 307. In addition, the AGC circuit 309 deployed after the AAN circuit 303 operates to correct amplitude errors to the desired signal possibly introduced during AGC adjustment caused by AGC circuit 307. In this way, AGC circuit 309 complements or compensates AGC circuit 307. In an embodiment, the compensating gain provided by AGC circuit 309 is equal to the total gain (fixed value) of the overall circuit minus the gain provided by AGC circuit 307. Note that exact symmetry between the gain stages is not required, and a degree of gain difference between AGC circuit 307 and AGC circuit 309 may be tolerated (e.g., such as plus or minus 2 dB, or 1 dB, or 0.5 dB, or 0.25 dB, or 0.1 dB, or 0.05 dB). The C-AGC scheme provides the benefits of AGC without the drawbacks of amplitude decoding errors stemming from gain adjustment. So, for instance, the complementary-AGC scheme disclosed herein according to some example embodiments provides increased dynamic range of the AGC while still allowing error-free data recovery during fast AGC adjustments.

In the example scenario depicted in FIG. 3, the jammer signal is a pulse, and the amplitude of the pulse is reduced by the AGC circuit 307 to a predetermined level, as evidenced by the relatively large amplitude jammer signal pulse at the input of the AGC circuit 307 and the relatively smaller amplitude at the output of the AGC circuit 307. As can be further scene, a comparable reduction in gain is also applied to the desired signal pulse. In addition, the AGC circuit 307 can maintain an optimal or otherwise expected input power at the AAN circuit 303 for effective nulling (the J/D ratio can be set as desired), while simultaneously protecting the AAN circuit 303 from excessive input power levels. The AGC circuit 309 effectively operates to neutralize the change in output level provided by the AGC circuit 307. As can be seen at the output of the AGC circuit 309, nulling with complementary AGC provides optimal J/D improvement and limits decoding errors to the desired signal.

Figure 5A:
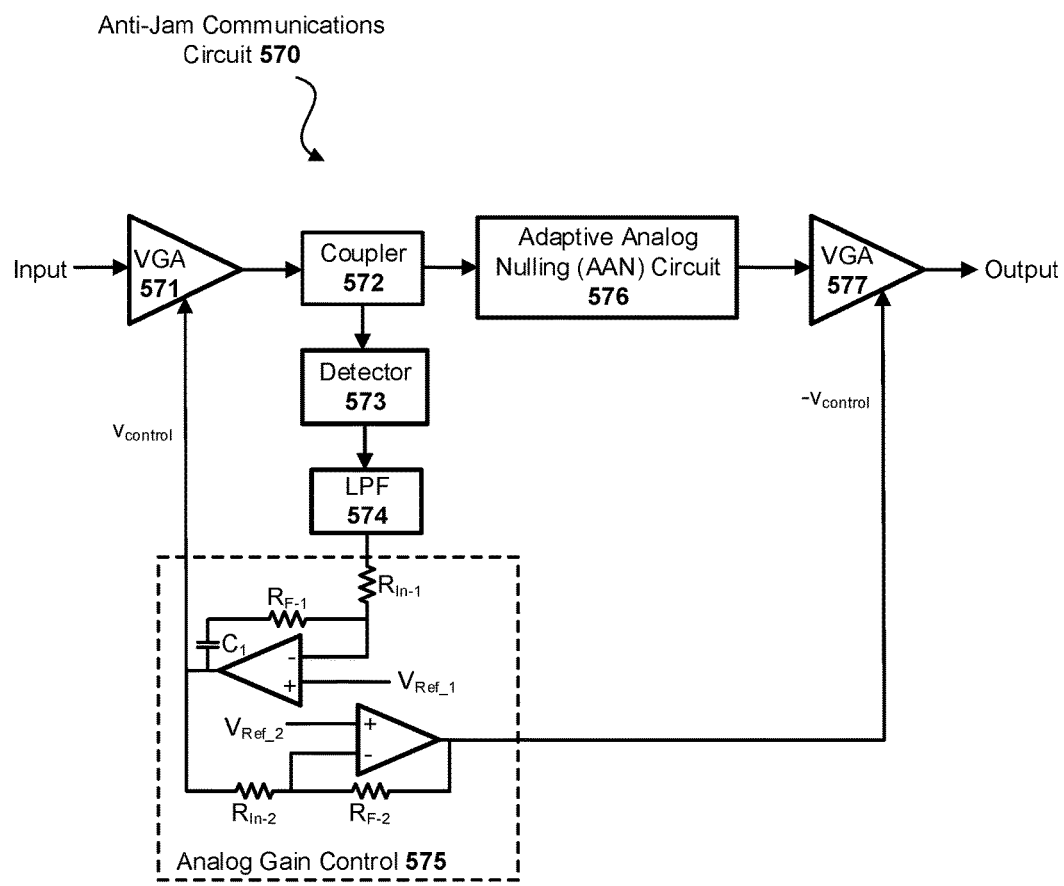
FIG. 5a schematically illustrates an example anti-jam communications circuit configured with adaptive analog nulling (AAN) and complementary automatic gain control (C-AGC), in accordance with an embodiment of the present disclosure.
Figure 5B:
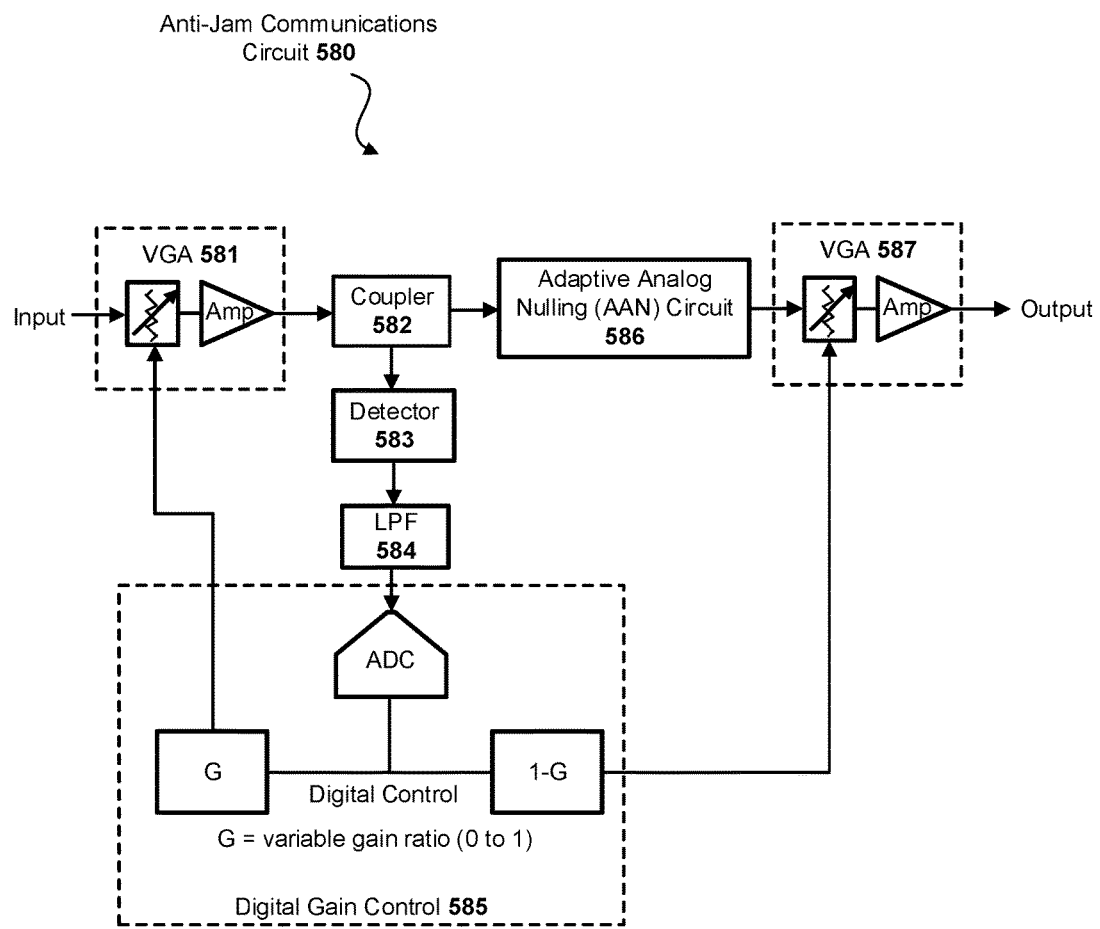
FIG. 5b schematically illustrates an example anti-jam communications circuit configured with adaptive analog nulling (AAN) and complementary automatic gain control (C-AGC), in accordance with another embodiment of the present disclosure.

Note that the C-AGC system can be implemented in the digital domain rather than the analog domain. FIG. 5a illustrates an example analog C-AGC system, while FIG. 5b illustrates an example digital C-AGC system, and will be discussed in turn. However, further note that analog gain correction maintains the desired communications signal level ultimately going into the RF receiver's analog-to-digital converter (ADC), and therefore may be less likely to result in quantization errors (signal too low) and/or clipping (signal too high) as a result of the AGC input stage response to an interferer.

As will be further appreciated, the complementary-AGC system and techniques provided herein may also be used in conjunction with other jammer signal suppression circuits and the present disclosure is not intended to be limited to AAN circuitry. For instance, in some embodiments, a tunable notch filter is used for jammer signal suppression instead of ANN circuit 303. In some such embodiments, if the tunable filter experiences distortion at high power levels, the complementary-AGC could maximize system dynamic range while avoiding modulation of the desired signal amplitude with changes in interference power. In any such cases, the complementary-AGC solution can be implemented in conjunction with a given suppression stage to provide increased dynamic range of the AGC while still allowing error-free data recovery during fast AGC adjustments.

Further details with respect to example AAN and C-AGC circuits will be discussed with respect to FIGS. 4a-b and 5a-b, in accordance with some example embodiments.

Adaptive Analog Nulling

Figure 4A:
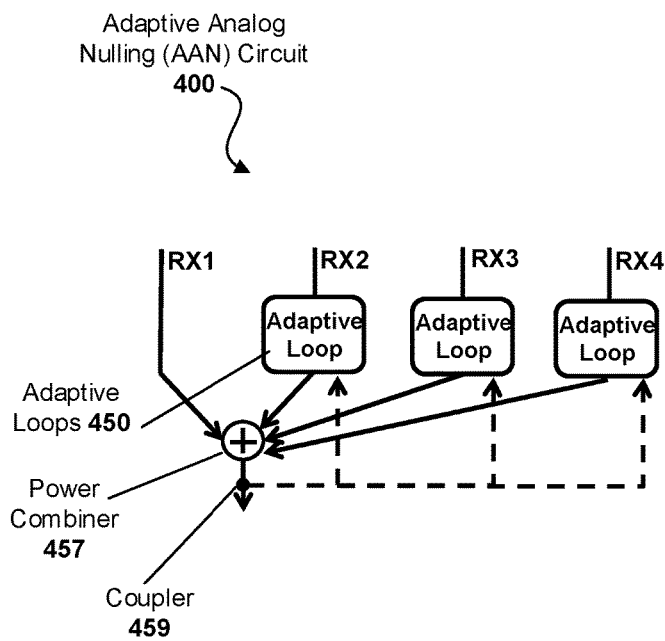
FIGS. 4a-b illustrate an example adaptive analog nulling (AAN) circuit that can be used in any of the receiver system configurations provided herein, in accordance with an embodiment of the present disclosure.
Figure 4B:
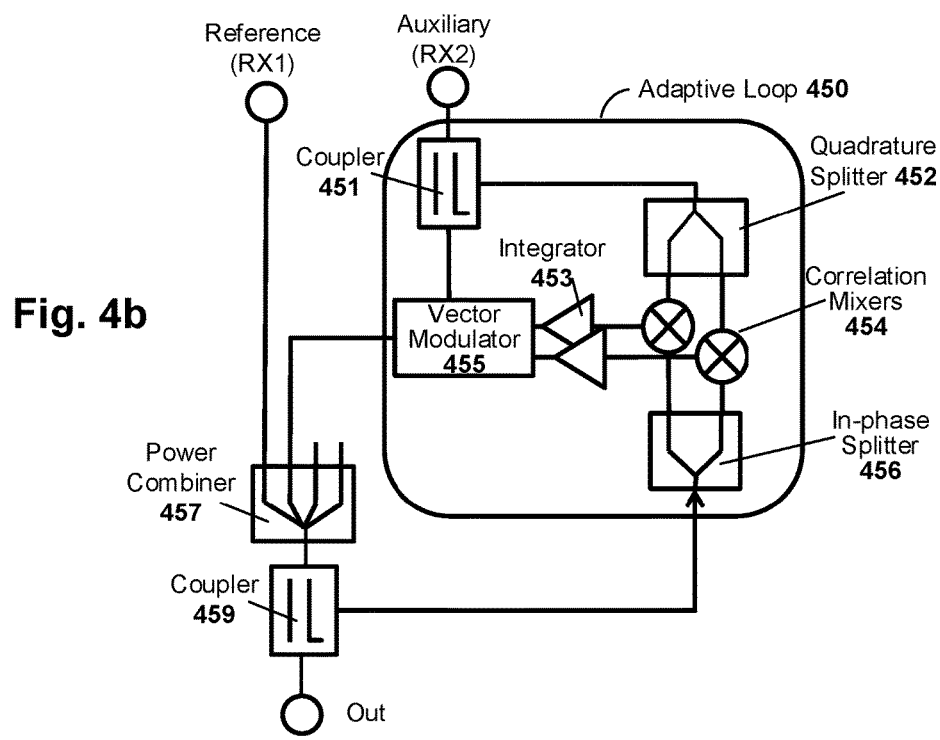

FIGS. 4a-b illustrate an example adaptive analog nulling (AAN) circuit that can be used in any of the receiver system configurations provided herein, in accordance with an embodiment of the present disclosure. The AAN circuit 400 can be used, for instance, in any of anti-jam communications circuits 100, 200, or 300, to implement the respective AAN circuits 103, 203, and 303. In a more general sense, spatial nulling of an interferer can be achieved by an antenna array with adaptive weight control. Any number of AAN circuit configurations can be used.

Note that this example architecture includes a Least-Mean-Square (LMS) or Howells-Applebaum adaptive control loop. In more detail, AAN circuit 400 includes a power combiner 457 which causes summation of a reference antenna signal (RX1) with one or more weighted (magnitude and phase) auxiliary antenna signals (RX2, RX3, and RX4), which in turn can produce cancellation of a large undesired interferer. Although this example embodiment shows three auxiliary antenna signals, any number of auxiliary antenna signals can be used. As can be further seen, each weighted auxiliary antenna signal is provided by a corresponding adaptive loop 450. An output coupler 459 samples the summed output power from the combiner 457 at a predetermined coupling ratio X dB to provide feedback to the adaptive loops 450, and further provides an output having reduced jammer signal amplitude. The predetermined coupling ratio can vary from one embodiment to the next, but in some cases is about 0.9 coupling ratio, where about 90% of power received at the input of coupler 459 is provided at output at the coupler 459, and the other 10% of power is provided as feedback to the adaptive loops 450. Any number of suitable coupling ratios can be used. With frequency and/or spatial separation between the jammer signal and the desired signal, the jammer-to-desired (J/D) signal ratio can be improved by the AAN circuit 400.

FIG. 4b illustrates further details of AAN circuit 400, in accordance with an embodiment of the present disclosure. As can be seen, the adaptive loop 450 includes an input coupler 451, a quadrature splitter 452, an integrator 453, a correlator 454, a vector modulator 455, and an in-phase splitter. This particular example is shown as receiving auxiliary antenna signals RX2, but of course could be any of the N auxiliary antenna signals to be processed.

The input coupler 451 samples the input weighted auxiliary antenna input signal (in this example case, RX2 signal) and provides a representation of that signal to the quadrature splitter 452, and another representation (of greater magnitude) to the vector modulator 455. The vector modulator 455 adjusts the amplitude and phase of the RX2 signal for maximum or an otherwise desired level of cancellation when summed with the reference RX1 signal. In addition, the output coupler 459 samples the summed output power (as previously explained) and provides a representation of that output signal to the in-phase splitter 456. As will be further appreciated, the quadrature splitter 452 provides quadrature (90°) channel data, and the in-phase splitter 456 provides in-phase channel data. As can be further seen, the correlation mixer 454 compares RX2 and the summed output power in-phase and quadrature to produce I and Q (in-phase and quadrature) error signals. The integrator 453 operates to set the vector modulator 455 controls such that closed-loop error signal is driven to zero. A similar adaptive loop 450 can be applied to each of the weighted auxiliary antenna input signals.

As previously noted, other interference cancelling circuits can be used in conjunction with the AGC schemes provided herein, and the present disclosure is not intended to be limited to adaptive analog nulling. Any number of adaptive filtering techniques can be used to reduce the impact of jammer signals.

Anti-Jam Circuitry

FIG. 5a schematically illustrates an example anti-jam communications circuit configured with adaptive analog nulling (AAN) and complementary automatic gain control (AGC), in accordance with an embodiment of the present disclosure. As can be seen, the anti-jam communications circuit 570 includes a variable gain amplifier (VGA) 571 operatively coupled to an AAN circuit 576 via coupler 572. The output of the AAN circuit 576 is provided to a second VGA 577. In addition, a control/feedback loop is fed at the output of the VGA 571 and includes power detector 573, a low pass filter (LPF) 574, and an analog gain control circuit 575. The analog gain control circuit 575 sets the gain of both VGA 571 and VGA 577, but in a complementary fashion such that the overall VGA gain doesn't impact or otherwise negligibly impacts the overall gain of the anti-jam communications circuit 570. In particular, VGA 577 applies complementary gain control to offset gain variation introduced by VGA 571.

In more detail, the VGA 571 receives the input signal from the given antenna array and generates an output signal having a stable output level, based on the $V_{control}$ signal. The coupler 572 provides a first representation of the signal at the output of VGA 571 to the AAN circuit 576, and a second relatively smaller representation to the detector 573. The output of the detector 573 is low-pass filtered by LPF 574. The filtered detector output is received by the analog gain control circuit 575, which includes a pair of complementary control circuits for providing the VGA gain control voltages $V_{control}$ and $-V_{control}$, respectively. The first control circuit of analog gain control 575 is implemented as an integrating amplifier having a gain of $R_{F-1}/R_{in-1}$, in this example embodiment. The value of the input resistor ($R_{F-1}$) and the feedback resistor ($R_{F-1}$) can be set to provide the desired gain, whether it is unity, attenuation, or amplification. The filtered detector output of LPF 574 is compared against a reference voltage ($V_{Ref\_1}$) to generate an error signal, which is then integrated to generate the gain control voltage $V_{control}$ for the VGA circuit 571. This is applied to the control input of the VGA 571. The second control circuit of analog gain control 575 is implemented as an inverting amplifier having a gain of $R_{F-2}/R_{in-2}$, in this example embodiment. The value of the input resistor ($R_{F-2}$) and the feedback resistor ($R_{F-2}$) can be set to provide the desired gain, whether it is unity, attenuation, or amplification. The output of the first control circuit of analog gain control 575 is compared against a reference voltage ($V_{Ref\_2}$) to generate an error signal, which is used as the gain control voltage $-V_{control}$ for the VGA circuit 577. As will be appreciated, the complementary nature of analog gain control 575 substantially neutralizes (within an acceptable tolerance) any gain provided by VGA 571 by providing a compensating gain by way of VGA 577.

The coupler 572 can be any suitable coupler device that allows the signals of interest to be sampled. The detector 573 can be any suitable detector circuit, such as a diode detector, a rectifier or so-called envelope detector, a logarithmic detector, a square-law detector, or an RMS detector, to name a few examples. In a more general sense, any suitable power detector circuit can be used. The LPF 574 can be an active or passive filter and may include any number of poles, depending on particulars of the given application such as the frequency band of interest and desired degree of attenuation for out-of-band signals. The coupler 572, detector 573, and LPF 574 are generally referred to herein as a sampling circuit, according to an embodiment. The AAN circuit 576 can be any suitable interference cancellation circuit that can operate in conjunction with the complementary AGC scheme as variously provided herein. In one embodiment, the AAN circuit 576 is similar to the AAN circuit 400 shown in FIGS. 4a-4b. The VGA circuits 571 and 577 can be any type of commercially available or customized variable gain amplifier circuitry having a gain that is adjustable based on a voltage control signal.

FIG. 5b schematically illustrates an example anti-jam communications circuit configured with adaptive analog nulling (AAN) and complementary automatic gain control (AGC), in accordance with another embodiment of the present disclosure. As can be seen, the anti-jam communications circuit 580 includes a VGA 581 operatively coupled to an AAN circuit 586 via coupler 582. The output of the AAN circuit 586 is provided to a second VGA 587. In addition, a control/feedback loop is fed at the output of the VGA 581 and includes power detector 583, an LPF 584, and a digital gain control circuit 585. The digital gain control circuit 585 sets the gain of both VGA 581 and VGA 587, but in a complementary fashion such that the overall VGA gain doesn't impact or otherwise negligibly impacts the overall gain of the anti-jam communications circuit 580. In particular, VGA 587 applies complementary gain control to offset gain variation introduced by VGA 581. So, for instance, the system may have total gain fixed at 10 dB (or some other target gain value) and the C-AGC just holds to within some tolerance of that target gain. The tolerance can be set as desired, but in some cases is about +/−5%, or +/−10%, or +/−15%, or +/−20% of the target. Note the tolerance need not be symmetrical. For instance, in still other embodiments, the tolerance is in the range between about +5% and −10%, or +15% and −5% of the target. Numerous tolerances can be used, as will be appreciated in light of this disclosure.

In more detail, the VGA 581 receives the input signal from the given antenna array and generates an output signal having a stable output level, based on the digital control signal from gain block G of digital gain control 585. The coupler 582 provides a first representation of the signal at the output of VGA 581 to the AAN circuit 586, and a second relatively smaller representation to the detector 583. The output of the detector 583 is low-pass filtered by LPF 584. The filtered detector output is received by the digital gain control circuit 585, which includes an analog to digital conversion (ADC) circuit that feeds a pair of control circuits for providing complementary digital gain control to VGA 581 and VGA 587. The first control circuit of digital gain control 585 receives the digital output of the ADC, and provides variable gain ratio G (0 and 1) digital output. This variable gain ratio G is applied to the control input of the VGA 581. The second control circuit of digital gain control 585 is the same as the first control circuit and the previous relevant discussion equally applies here, except that the second control circuit receives the digital output of the ADC circuit and provides variable gain ratio 1-G (the complement of G). As will be appreciated in light of this disclosure, the complementary nature of digital gain control 585 neutralizes any gain provided by VGA 581 by providing a compensating gain by way of VGA 587.

The coupler 582 can be any suitable coupler device that allows the signals of interest to be sampled. The detector 583 can be any suitable detector circuit, such as a diode detector, a rectifier or so-called envelope detector, a logarithmic detector, a square-law detector, or an RMS detector, to name a few examples. In a more general sense, any suitable power detector circuit can be used. The LPF 584 can be an active or passive filter and may include any number of poles, depending on particulars of the given application such as the frequency band of interest and desired degree of attenuation for out-of-band signals. The coupler 582, detector 583, and LPF 584 are generally referred to herein as a sampling circuit, according to an embodiment. In some embodiments, the ADC circuit of the digital gain control 585 may also be considered part of the sampling circuit. The AAN circuit 586 can be any suitable interference cancellation circuit that can operate in conjunction with the complementary AGC scheme as variously provided herein. In one embodiment, the AAN circuit 586 is similar to the AAN circuit 400 shown in FIGS. 4a-4b. In the example embodiment shown, the VGA circuits 581 and 587 are implemented using an amplifier with a digital step attenuator, for a digitally-controlled complementary AGC. In a more general sense, VGA circuits 581 and 587 can be any type of commercially available or customized digital variable gain amplifier circuitry having a gain that is adjustable based on a digital control signal.

Note that, in the example embodiment shown in FIG. 5b, even though gain is being controlled by a digital step attenuator, the VGAs 581 and 587 are still controlling the signal while it is in the analog domain. However, in other embodiments, such as those including an overall receiver architecture (such as shown in FIG. 6), the amplitude correction can occur by a digital signal processor (DSP) after the ADC so that complementary gain correction occurs in the digital domain (e.g., in block 611 of FIG. 6).

RF Receiver System

Figure 6:
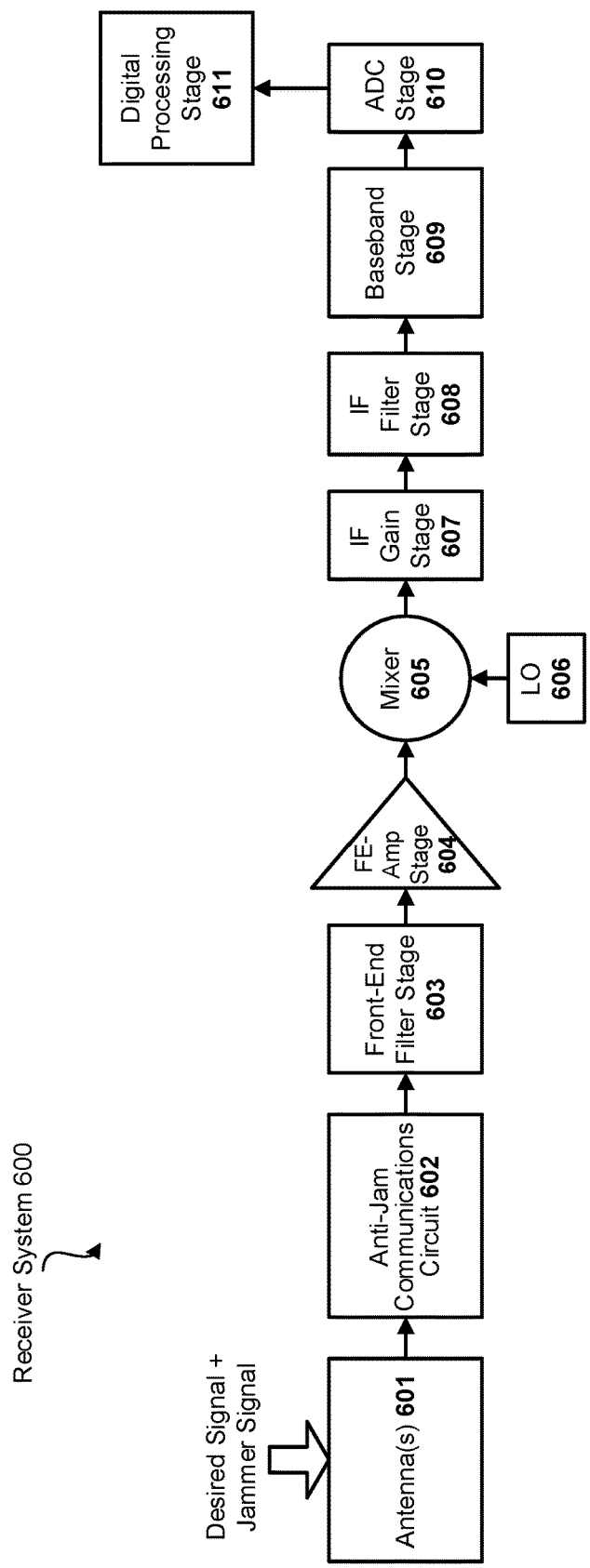
FIG. 6 illustrates a block diagram of an RF receiver system configured with an anti-jam communications circuit, in accordance with an embodiment of the present disclosure.

FIG. 6 illustrates a block diagram of an RF receiver system configured with an anti-jam communications circuit, in accordance with an embodiment of the present disclosure. As can be seen, receiver system 600 includes an anti-jam communications circuit 602 operatively coupled between antenna(s) 601 and the front-end filter stage of the receiver. The receiver system 600 further includes a front-end amplifier stage 604, a mixer stage 605, a local oscillator (LO) 606, an IF gain stage 607, and IF filter stage 608, a baseband stage 609, an ADC stage 610, and a digital processing stage 611. As will be appreciated, the receiver system 600 can be implemented with any number of receiver blocks, and the present disclosure is not intended to be limited to the particular example receiver configuration shown, which happens to be a superheterodyne receiver configuration.

Anti-communications circuit 602 can be, for example, of the anti-jam communications circuit 300, 570, or 580. The anti-jam communications circuit 200 may be used as well, but is susceptible to signal decoding errors and poor throughput as previously explained. The antenna(s) 601 can be, for instance, implemented as any of antennas 101, 201, 301, although any suitable antenna configurations can be used. The remainder of the stages 603 through 611 can be implemented using standard or custom configurations, depending on the application. The front-end filter stage 603 is configured to remove out-of-band signals and the amplification stage 604 amplifies the in-band signals. Mixer 605 operates in conjunction with LO 606 to down convert the received RF signal to some intermediate frequency (IF). The resulting IF signals are then amplified by stage 607 and filtered by stage 609, and processed through the baseband stage which may further down-convert the received signals of interest. The baseband signals are then converted to the digital domain by ADC stage 610, and the digital signals are then provided the digital processing stage 611 for analysis and processing. Because the receiver system 600 includes the anti-jam communications circuit 602, the desired signal received at the antenna(s) can be efficiently and successfully decoded despite the presence of jammer signals.

Further Example Embodiments

The following examples pertain to further embodiments, from which numerous permutations and configurations will be apparent.

Example 1 is an anti-jam communications system, comprising: a first automatic gain control (AGC) circuit having an input to receive RF signals captured by an antenna, and an output to provide a first gain adjusted version of the received RF signals, the received RF signals including a desired signal and a jammer signal; an interference suppression circuit having an input to the first gain adjusted version of the received RF signals, and to suppress the jammer signal, thereby providing a second gain adjusted version of the received RF signals; and a second AGC circuit having an input to receive the second gain adjusted version of the received RF signals, and an output to provide a third gain adjusted version of the received RF signals; wherein gain provided by the first AGC circuit is substantially complementary to gain provided by the second AGC circuit. As used herein, note that "substantially complementary" does not require a perfect complementary relationship between the first and second AGC circuits, so as to provide zero impact on the total target gain of the system. Rather, there may be an acceptable tolerance with respect to the complementary relationship between the first and second AGC circuits. So, for instance, the system may have a total target gain fixed at 10 dB (or some other target gain value or range), not counting any impact on that gain by the first and second AGC circuits. Because the gain provided by the first AGC circuit is substantially complementary to gain provided by the second AGC circuit, the actual total gain will be within some acceptable tolerance of the total target gain. The tolerance can be set as desired, but in some cases is about +/−5%, or +/−10%, or +/−15%, or +/−20% of the target. Note the tolerance need not be symmetrical. For instance, in still other embodiments, the tolerance is in the range of about +5% and −10%, or +15% and −5% of the target. In a more general sense, substantially complementary means that the gain provided by the second AGC circuit is intended to counter or otherwise offset the gain provided by the first AGC circuit, so that the impact on the overall target gain of the system is within a given tolerance.

Example 2 includes the subject matter of Example 1, and further includes the antenna operatively coupled to the input of the first AGC circuit; and a radio frequency (RF) receiver operatively coupled to the output of the second AGC circuit.

Example 3 includes the subject matter of Example 1 or 2, wherein the antenna is an adaptive antenna array.

Example 4 includes the subject matter of any of the preceding Examples, wherein the interference suppression circuit includes an adaptive analog nulling circuit.

Example 5 includes the subject matter of any of the preceding Examples, wherein the interference suppression circuit includes a notch filter.

Example 6 includes the subject matter of any of the preceding Examples, wherein the sum of the gain provided by the first AGC circuit and the gain provided by the second AGC is within the range of −1.0 dB to +1.0 dB.

Example 7 includes the subject matter of any of the preceding Examples, wherein the sum of the gain provided by the first AGC circuit and the gain provided by the second AGC is within the range of −0.5 dB to +0.5 dB.

Example 8 includes the subject matter of any of the preceding Examples, wherein the first AGC circuit comprises: a first variable gain amplifier having a gain that is adjustable based on a first control signal; a sampling circuit to generate a representation of the first gain adjusted version of the received RF signals; and a first control circuit to receive the representation of the first gain adjusted version of the received RF signals and to provide the first control signal to the first variable gain amplifier.

Example 9 includes the subject matter of Example 8, wherein the second AGC circuit comprises: a second variable gain amplifier having a gain that is adjustable based on a second control signal; and a second control circuit to provide the second control signal to the second variable gain amplifier, the second control signal being substantially complementary to the first control signal.

Example 10 includes the subject matter of Example 9, wherein the first and second control circuits each includes an inverting amplifier circuit, the second control circuit to receive the first control signal, and the first and second control signals are analog control signals.

Example 11 includes the subject matter of Example 9, wherein the first and second control circuits each provides a variable gain ratio G (0 and 1) digital output, and the first and second control signals are digital control signals.

Example 12 includes the subject matter of any of Examples 8 through 11, wherein the sampling circuit includes one or more of a coupler, a power detector, and/or a low pass filter.

Example 13 includes the subject matter of Example 12, wherein the sampling circuit further includes an analog to digital converter (ADC).

Example 14 is an anti-jam communications system, comprising: a first automatic gain control (AGC) circuit having an input to receive RF signals captured by an adaptive antenna array, and an output to provide a first gain adjusted version of the received RF signals, the received RF signals including a desired signal and a jammer signal; an interference suppression circuit having an input to the first gain adjusted version of the received RF signals, and to suppress the jammer signal, thereby providing a second gain adjusted version of the received RF signals; and a second AGC circuit having an input to receive the second gain adjusted version of the received RF signals, and an output to provide a third gain adjusted version of the received RF signals. The first AGC circuit includes a first variable gain amplifier having a gain that is adjustable based on a first analog control signal; a sampling circuit to generate a representation of the first gain adjusted version of the received RF signals; and a first control circuit to receive the representation of the first gain adjusted version of the received RF signals and to provide the first analog control signal to the first variable gain amplifier. The second AGC circuit includes a second variable gain amplifier having a gain that is adjustable based on a second analog control signal; and a second control circuit to receive the first analog control signal and to provide the second analog control signal to the second variable gain amplifier, the second analog control signal being substantially complementary to the first analog control signal. Gain provided by the first AGC circuit is substantially complementary to gain provided by the second AGC circuit.

Example 15 includes the subject matter of Example 14, and further includes the adaptive antenna array operatively coupled to the input of the first AGC circuit; and a radio frequency (RF) receiver operatively coupled to the output of the second AGC circuit.

Example 16 includes the subject matter of Example 14 or 15, wherein the interference suppression circuit includes one or more of an adaptive analog nulling circuit and/or a notch filter.

Example 17 includes the subject matter of any of Examples 14 through 16, wherein the sum of the gain provided by the first AGC circuit and the gain provided by the second AGC is within the range of −1.0 dB to +1.0 dB. Other tolerances regarding the complementary nature of the first and second AGC circuits will be appreciated, whether symmetrical about zero, or asymmetrical about zero.

Example 18 is an anti-jam communications system, comprising: a first automatic gain control (AGC) circuit having an input to receive RF signals captured by an adaptive antenna array and an output to provide a first gain adjusted version of the received RF signals, the received RF signals including a desired signal and a jammer signal. The system further includes an interference suppression circuit having an input to the first gain adjusted version of the received RF signals, and to suppress the jammer signal, thereby providing a second gain adjusted version of the received RF signals. The system further includes a second AGC circuit having an input to receive the second gain adjusted version of the received RF signals, and an output to provide a third gain adjusted version of the received RF signals. The first AGC circuit includes a first variable gain amplifier having a gain that is adjustable based on a first digital control signal; a sampling circuit to generate a representation of the first gain adjusted version of the received RF signals; and a first control circuit to receive the representation of the first gain adjusted version of the received RF signals and to provide the first digital control signal to the first variable gain amplifier. The second AGC circuit includes a second variable gain amplifier having a gain that is adjustable based on a second digital control signal; and a second control circuit to provide the second digital control signal to the second variable gain amplifier, the second digital control signal being substantially complementary to the first digital control signal. Gain provided by the first AGC circuit is substantially complementary to gain provided by the second AGC circuit. In some cases, for instance, the sum of the gain provided by the first AGC circuit and the gain provided by the second AGC is within the range of −1.0 dB to +1.0 dB.

Example 19 includes the subject matter of Example 18, and further includes the adaptive antenna array operatively coupled to the input of the first AGC circuit; and a radio frequency (RF) receiver operatively coupled to the output of the second AGC circuit.

Example 20 includes the subject matter of Example 18 or 19, wherein the interference suppression circuit includes one or more of an adaptive analog nulling circuit and/or a notch filter.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An anti-jam communications system, comprising:
    a first automatic gain control (AGC) circuit having an input to receive RF signals captured by an antenna, and an output to provide a first gain adjusted version of the received RF signals, the received RF signals including a desired signal and a jammer signal;
    an interference suppression circuit having an input to the first gain adjusted version of the received RF signals, and to suppress the jammer signal, thereby providing a second gain adjusted version of the received RF signals; and
    a second AGC circuit having an input to receive the second gain adjusted version of the received RF signals, and an output to provide a third gain adjusted version of the received RF signals;
    wherein the sum of the gain provided by the first AGC circuit and the gain provided by the second AGC is within the range of −1.0 dB to +1.0 dB.

2. The anti-jam communications system of claim 1, further comprising:
    the antenna operatively coupled to the input of the first AGC circuit; and
    a radio frequency (RF) receiver operatively coupled to the output of the second AGC circuit.

3. The anti-jam communications system of claim 2, wherein the antenna is an adaptive antenna array.

4. The anti-jam communications system of claim 1, wherein the interference suppression circuit includes an adaptive analog nulling circuit.

5. The anti-jam communications system of claim 1, wherein the interference suppression circuit includes a notch filter.

6. The anti-jam communications system of claim 1, wherein the sum of the gain provided by the first AGC circuit and the gain provided by the second AGC is within the range of −0.5 dB to +0.5 dB.

7. The anti-jam communications system of claim 1, wherein the first AGC circuit comprises:
    a first variable gain amplifier having a gain that is adjustable based on a first control signal;
    a sampling circuit to generate a representation of the first gain adjusted version of the received RF signals; and
    a first control circuit to receive the representation of the first gain adjusted version of the received RF signals and to provide the first control signal to the first variable gain amplifier.

8. The anti-jam communications system of claim 7, wherein the second AGC circuit comprises:
    a second variable gain amplifier having a gain that is adjustable based on a second control signal; and
    a second control circuit to provide the second control signal to the second variable gain amplifier, the second control signal being substantially complementary to the first control signal.

9. The anti-jam communications system of claim 8, wherein the first and second control circuits each includes an inverting amplifier circuit, the second control circuit to receive the first control signal, and the first and second control signals are analog control signals.

10. The anti-jam communications system of claim 8, wherein the first and second control circuits each provides a variable gain ratio G (0 and 1) digital output, and the first and second control signals are digital control signals.

11. The anti-jam communications system of claim 7, wherein the sampling circuit includes one or more of a coupler, a power detector, and/or a low pass filter.

12. The anti-jam communications system of claim 11, wherein the sampling circuit further includes an analog to digital converter (ADC).

13. An anti-jam communications system, comprising:
    a first automatic gain control (AGC) circuit having an input to receive RF signals captured by an adaptive antenna array, and an output to provide a first gain adjusted version of the received RF signals, the received RF signals including a desired signal and a jammer signal, wherein the first AGC circuit includes
        a first variable gain amplifier having a gain that is adjustable based on a first analog control signal;
        a sampling circuit to generate a representation of the first gain adjusted version of the received RF signals; and
        a first control circuit to receive the representation of the first gain adjusted version of the received RF signals and to provide the first analog control signal to the first variable gain amplifier;
    an interference suppression circuit having an input to the first gain adjusted version of the received RF signals, and to suppress the jammer signal, thereby providing a second gain adjusted version of the received RF signals; and a second AGC circuit having an input to receive the second gain adjusted version of the received RF signals, and an output to provide a third gain adjusted version of the received RF signals, wherein the second AGC circuit includes a second variable gain amplifier having a gain that is adjustable based on a second analog control signal; and a second control circuit to receive the first analog control signal and to provide the second analog control signal to the second variable gain amplifier, the second analog control signal being substantially complementary to the first analog control signal;

wherein gain provided by the first AGC circuit is substantially complementary to gain provided by the second AGC circuit.

14. The anti-jam communications system of claim 13, further comprising:

the adaptive antenna array operatively coupled to the input of the first AGC circuit; and a radio frequency (RF) receiver operatively coupled to the output of the second AGC circuit.

15. The anti-jam communications system of claim 13, wherein the interference suppression circuit includes one or more of an adaptive analog nulling circuit and/or a notch filter.

16. The anti-jam communications system of claim 13, wherein the sum of the gain provided by the first AGC circuit and the gain provided by the second AGC is within the range of −1.0 dB to +1.0 dB.

17. An anti-jam communications system, comprising:

a first automatic gain control (AGC) circuit having an input to receive RF signals captured by an adaptive antenna array, and an output to provide a first gain adjusted version of the received RF signals, the received RF signals including a desired signal and a jammer signal, wherein the first AGC circuit includes a first variable gain amplifier having a gain that is adjustable based on a first digital control signal;

a sampling circuit to generate a representation of the first gain adjusted version of the received RF signals; and a first control circuit to receive the representation of the first gain adjusted version of the received RF signals and to provide the first digital control signal to the first variable gain amplifier;

an interference suppression circuit having an input to the first gain adjusted version of the received RF signals, and to suppress the jammer signal, thereby providing a second gain adjusted version of the received RF signals; and a second AGC circuit having an input to receive the second gain adjusted version of the received RF signals, and an output to provide a third gain adjusted version of the received RF signals, wherein the second AGC circuit includes a second variable gain amplifier having a gain that is adjustable based on a second digital control signal; and a second control circuit to provide the second digital control signal to the second variable gain amplifier, the second digital control signal being substantially complementary to the first digital control signal;

wherein gain provided by the first AGC circuit is substantially complementary to gain provided by the second AGC circuit.

18. The anti-jam communications system of claim 17, further comprising:

the adaptive antenna array operatively coupled to the input of the first AGC circuit; and a radio frequency (RF) receiver operatively coupled to the output of the second AGC circuit.

19. The anti-jam communications system of claim 17, wherein the interference suppression circuit includes one or more of an adaptive analog nulling circuit and/or a notch filter.

* * * * *